(12) United States Patent
Dong et al.

(10) Patent No.: US 7,126,974 B1
(45) Date of Patent: Oct. 24, 2006

(54) RING GEOMETRY DIODE LASER ARRAYS AND METHODS

(75) Inventors: Jun Dong, Tokyo (JP); Michael Bass, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 231 days.

(21) Appl. No.: 10/819,554

(22) Filed: Apr. 7, 2004

Related U.S. Application Data

(60) Provisional application No. 60/461,336, filed on Apr. 9, 2003.

(51) Int. Cl.
*H01S 3/06* (2006.01)

(52) U.S. Cl. .............................. 372/67; 372/75; 372/70

(58) Field of Classification Search .................... 372/67
See application file for complete search history.

(56) References Cited

U.S. PATENT DOCUMENTS

| | | | | |
|---|---|---|---|---|
| 5,086,433 A * | 2/1992 | Pocholle et al. | ............... | 372/72 |
| 5,140,607 A * | 8/1992 | Paiva | ........................... | 372/70 |
| 5,627,850 A | 5/1997 | Irwin et al. | .................. | 372/43 |
| 6,438,152 B1 | 8/2002 | Contag et al. | ................ | 372/70 |
| 6,577,666 B1 | 6/2003 | Erhard et al. | .................. | 372/70 |
| 6,603,793 B1 | 8/2003 | Vetrovec | ....................... | 372/95 |
| 6,625,193 B1 | 9/2003 | Vetrovec | ....................... | 372/70 |
| 6,647,037 B1 | 11/2003 | Irwin | ........................... | 372/36 |
| 6,661,827 B1 | 12/2003 | Lam et al. | ..................... | 372/75 |
| 6,834,070 B1 * | 12/2004 | Zapata | ........................ | 372/70 |

OTHER PUBLICATIONS

"*A 1-kW CW Thin Disc Laser,*" Christian Stewen, et al., IEEE Journal of Selected Topics in Quantum Electronics, vol. 6, No. 4, Jul./Aug. 2000, pp. 650-657.
"*Compact Active Mirror Laser (CAMIL),*" John Vetrovec, preprint of a paper #4630-02 presented at the Photonics West Lase'2002 Conference, San Jose, CA, Jan. 22-26, 2001, pp. 1-12.

* cited by examiner

*Primary Examiner*—Minsun Oh Harvey
*Assistant Examiner*—Tod T. Van Roy
(74) *Attorney, Agent, or Firm*—Brian S. Steinberger; Law Offices of Brian S. Steinberger, P.A.

(57) ABSTRACT

Systems, configurations and methods of using laser diodes in ring-shaped arrays placed a distance away from thin disk solid-state laser gain media, which provide uniformly absorbed pump power distribution with high absorption efficiency. This results in major improvements in the scalability and ruggedness of such lasers and disk laser amplifiers. Use of the diode laser pump configurations of the invention results in compact, robust and scalable lasers that produce high quality, high power outputs.

21 Claims, 4 Drawing Sheets

RING GEOMETRY DIODE LASER ARRAYS AND METHODS

This invention claims the benefit of priority from U.S. Provisional patent application 60/461,336 filed Apr. 9, 2003.

FIELD OF THE INVENTION

This invention relates to high power output laser systems and more particularly to those high power laser systems and methods of producing high power lasers with diode arrays, which are compact, use fewer optical elements and have increased ease of adjustment of power delivery and laser output.

BACKGROUND AND PRIOR ART

The current art for disk laser pumping involves either complex arrays of mirrors to redirect pump light from a conventional array into the disk many times to achieve both efficient absorption and uniformity or an array of diodes placed around the rim of the disk pumping through the rim towards the center. Both suffer from complexity and the former is not as rugged as applications demand. Also, both suffer from scalability limitations for higher power.

The current art is represented by the laser technology such as Giesen's multi-pass face pumped thin disk laser (see C. Stewen, K. Contag, M. Larionov, A. Giesen, and H. Hugel, "A 1-kW CW thin disc laser", *IEEE Journal of Selected Topics in Quantum Electronics*, 2000, 6(4): 650-657). Patents related to the work of Giesen and others include, U.S. Pat. No. 6,438,152 to Contag et al. disclosing a complex system with a plurality of pumping branches and U.S. Pat. No. 6,577,666 B2 to Erhard et al. with a plurality of optical refocusing legs. Vetrovec's proposal of edge pumping a disk gain medium (see J. Vetrovec, "Compact active mirror laser (CAMIL)", *SPIE, Photonics West Laser '2002 Conference*, San Jose, Calif., Jan. 22–26, 2001) also requires complex systems with many optical components and also have pump power delivery and laser outputs which are most often highly non-uniform. U.S. Pat. Nos. 6,603,793 B2 and 6,625,193 B2 to Vetrovec provide several arrangements of gain elements, diode arrays, optical medium and optical coatings to achieve high power lasers; however, all arrangements are unlike the arrangement of elements in the present invention.

In addition to the above, annular or circular arrangements of laser diode bars mounted in a dielectric block are disclosed in U.S. Pat. No. 5,627,850 to Irwin et al. and U.S. Pat. No. 6,647,037 B2 to Irwin. U.S. Pat. No. 6,661,827 B2 to Lam et al. discloses a radial array of laser diodes mounted in a segmented conductive ring surrounding a laser rod.

None of the prior art arrangements of diode bars, gain elements, or optical elements have the configuration of an open ring as disclosed herein. Not only does the present invention have a unique configuration, the invention meets the commercial need for a laser pump that is scalable to high power laser output, uses fewer optical elements, and is easy to adjust the pump power delivery and laser output to provide improved uniformity.

SUMMARY OF THE INVENTION

It is a primary objective of the present invention to develop a laser pump that is scalable to high power laser output and uses fewer optical elements.

Another object of the present invention is to provide a more efficient disk laser pump source that is scalable to higher powers and of increased ruggedness.

A further object of the present invention is to provide a disk laser pump that is easy to manufacture and compatible with both disk laser and disk amplifier configurations.

Preferred embodiments of the invention include a new configuration of diode laser bars to face pump thin disk solid state lasers comprising an array of diode bars placed on a washer shaped substrate and a method of modifying the output of a high average power disk laser comprising the steps of: operating said disk laser with an array of diode bars placed on a washer shaped substrate which allows laser light to reach the disk-shaped gain medium through its central hole; and, cooling said diode array from its back surface whereby said combination provides a more efficient disk laser pump source which is scalable to higher powers and is of increased ruggedness.

Further objects and advantages of this invention will be apparent from the following detailed description of the presently preferred embodiments, which are illustrated schematically in the accompanying drawings.

DESCRIPTION OF THE PREFERRED EMBODIMENTS

Figure 1A:
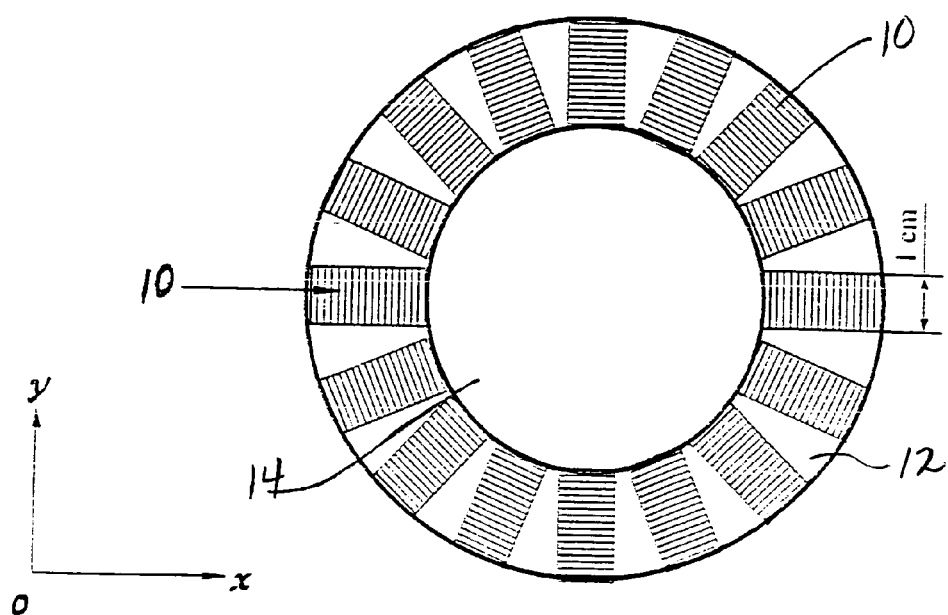
FIG. 1A shows a top view of the ring of diode bars in an array of diode bars placed on a flat washer shaped substrate.

Before explaining the disclosed embodiments of the present invention in detail, it is to be understood that the invention is not limited in its application to the details of the particular arrangements shown since the invention is capable of further embodiments. Also, the terminology used herein is for the purpose of description and not of limitation According to this invention, the above objects are met by incorporation of a new configuration of diode laser bars to face pump thin disk solid-state lasers. In FIG. 1 there is shown an array of diode bars 10, having a length of approximately 1 centimeter (cm), placed on a flat washer shaped substrate 12. The washer shaped substrate 12 allows laser light to reach the disk-shaped gain medium located below the central hole 14 of the substrate while arraying the diode bars 10 in such a manner as to be contiguous with the circular geometry of the substrate disk. The diode bars 10 can be fitted with beam control prisms shown as 18 in FIG. 4 or other optical elements to allow for control of the angular spread of the emitted light and its direction of propagation away from the surface of the array. An example of a beam control prism and other optical elements to control laser emitted light are shown in U.S. Pat. No. 5,208,456, which is incorporated by reference. Optical elements useful in focusing a light beam on the desired plane may be passive or in-line optics, including, but not limited to, lenses, mirrors and prisms. The array of diode bars 10 can be cooled from the back surface of the substrate 12 with a cooling device 200 (shown in FIG. 4). In FIG. 1, one group of the arrayed diode bars 10a, spaced approximately 15 cm from the thin disk 16, are shown delivering light to thin disk 16 of a solid-state laser gain medium. The diode bars are placed on the side of the ring facing the gain medium and the backside is cooled using various techniques known by those skilled in the art, such as, but not limited to, those described in U.S. Pat. Nos. 6,480,514, 5,105,430 and 5,105,429, which are incorporated by reference. An exemplary cooling technique can be a spray cooling system 200. The pump power pattern 17 shows some spill over of light off the edge of the disk 16. This can be controlled by adding slow axis angular spread control to the beam control prisms or by aiming the light in different manners. FIG. 1 shows that the diode bars 10 are stacked along radii of the washer shaped substrate 12 with their lengths perpendicular to the radii. This is one embodiment. Other embodiments would include those orienting the diode bar lengths at other angles with respect to the radii.

The choice of which diode bar 10 directs its light to which location on the surface of the disk gain medium depends on the particular application and the need for more uniformity or for more pump absorption efficiency. Again, any set of such choices is within the scope of the present invention.

Figure 1B:
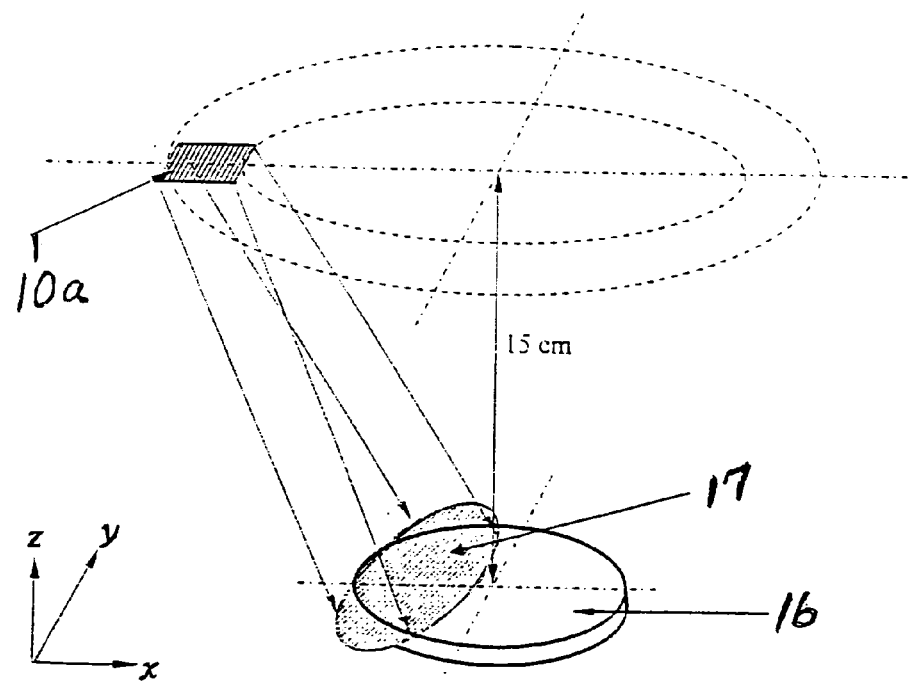
FIG. 1B shows one group of arrayed diode bars delivering light to thin disk of a solid-state laser gain medium.

FIGS. 2A, 2B, 2C, 2D, 2E, and 2F show the results of calculating the absorbed pump power density in a Yb:YAG laser disk 16 when it is pumped by an array such as shown in FIGS. 1A and 1B. The concentration of Yb is approximately 10 (atomic weight) at. %. The size of Yb:YAG thin disk is approximately 50 millimeters (mm) in diameter and approximately 2 mm in thickness. The distance between diode lasers and Yb:YAG is approximately 150 mm, approximately 132 diode bars are used and total power is approximately 5280 watts (W). The divergence angles of the diode lasers are approximately 20 and approximately 8 degrees. The incident angle of the diode laser is approximately 14 degrees. The diode lasers can be arranged as a ring with an inner radius of approximately 40 mm and the outer radius of approximately 56 mm. The uniformity of pump light distribution due to the array is excellent.

Figure 2A:
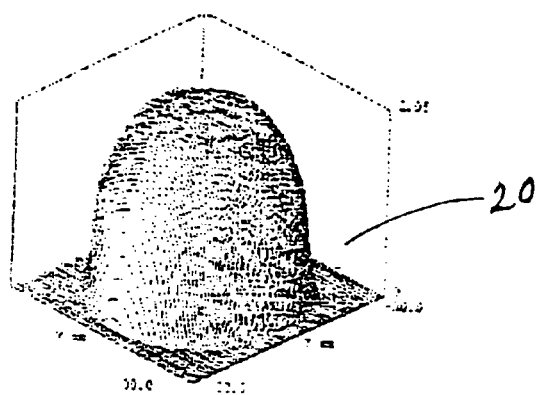
FIGS. 2A, 2B and 2C show the results of calculating the absorbed pump power density at the entrance surface of a Yb:YAG laser disk when it is pumped by an array such as shown in FIGS. 1A and 1B.
Figure 2C:
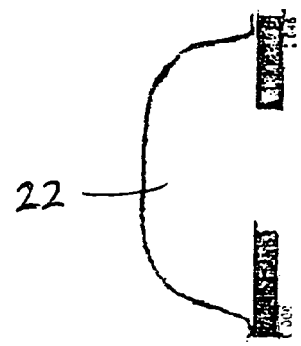
Figure 2B:
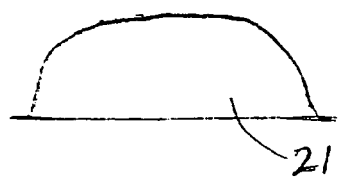

Referring now to FIG. 2A, a three-dimensional plot 20 shows the distribution of absorbed pump power at the entrance surface of a disk pumped by diode laser light from an array of diode lasers, as shown in FIGS. 1A and 1B. FIG. 2B shows a plot 21 of the cross section of the distribution of absorbed pump power in 20 taken parallel to the x axis in 20 and through the center of the disk. FIG. 2C is a plot 22 of the cross section of the distribution of absorbed pump power in 20 is taken parallel to the y axis in 20 and through the center of the disk.

Figure 2D:
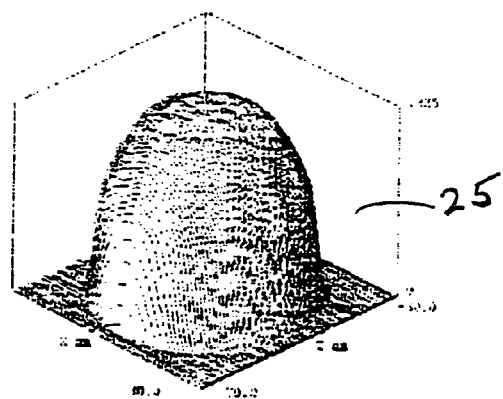
FIGS. 2D, 2E and 2F show the distribution of absorbed pump power at the back surface of a Yb:YAG laser disk when it is pumped by an array such as shown in FIGS. 1A and 1B.
Figure 2F:
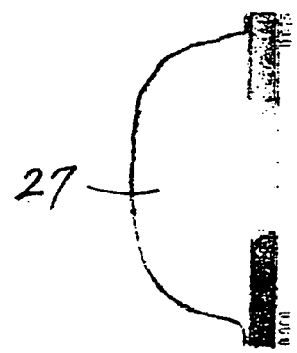
Figure 2E:
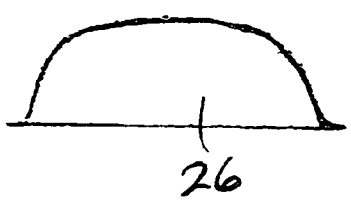

FIG. 2D is another three-dimensional plot 25 showing the distribution of absorbed pump power at the back surface of a disk pumped by diode laser light from an array of diode lasers, as shown in FIGS. 1A and 1B. FIG. 2E is a plot 26 of the cross section of the distribution of absorbed pump power in 25 taken parallel to the x axis in 25 and through the center of the disk. FIG. 2F is a plot 27 of the cross section of the distribution of absorbed pump power in 25 taken parallel to the y axis of 25 and through the center of the disk.

The efficiency of absorption is approximately 78%. By simply accepting a lower efficiency, the roll off in absorbed pump power at the rim of the disk 16 can be eliminated. As indicated above and shown in FIG. 3, there are other means, to achieve an improvement in uniformity without giving up absorption efficiency.

Figure 3:
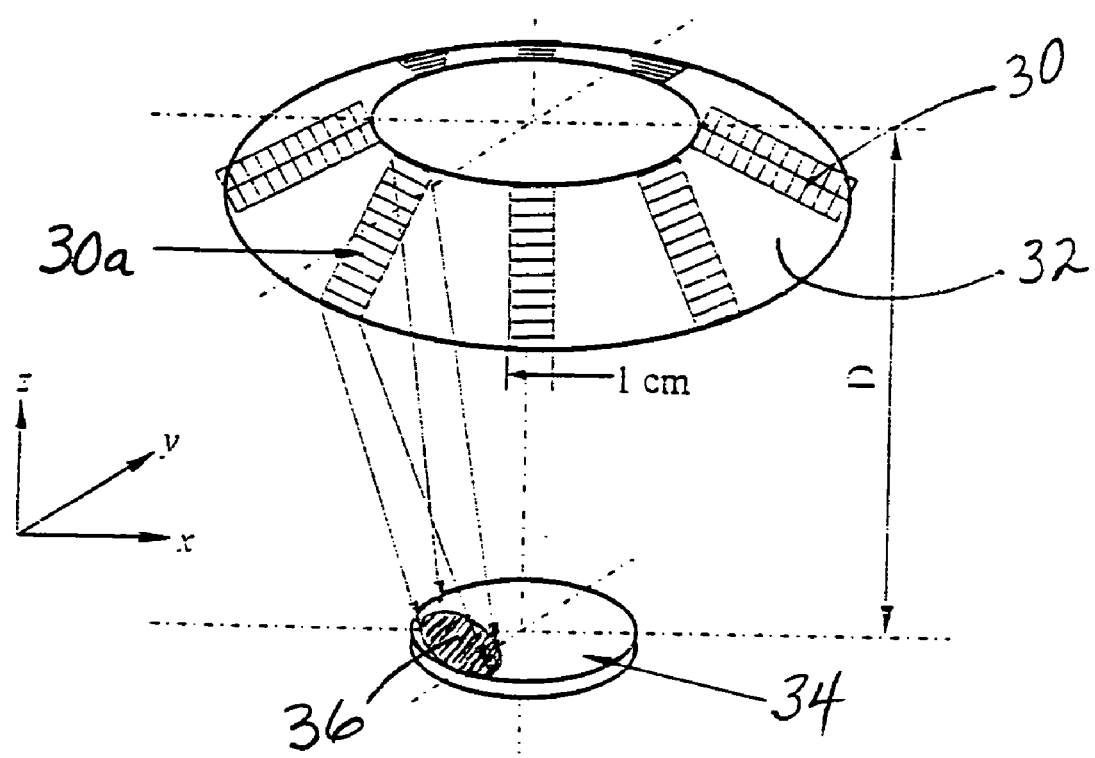
FIG. 3 shows a laser diode array configured on the inside of a conical ring for face-pumping a thin disk laser.

FIG. 3 shows an alternative to the flat washer array, and is another embodiment of the present invention. By arraying the diode bars 30 on the inside of a conical ring 32, some of the diode bars 30 are closer to the thin disk 34 than others. Line D is the distance between the diode bars 30 and the thin disk 34, a distance that can be variable. The slow axis spread problem alluded to above can be compensated for, by this approach, as the near diode bars 30a produce light 36 that spreads less and spills over the rim of the disk less when it reaches the surface of the disk 34. This provides a wider range of choices as to which area of the disk 34 is illuminated by which diode bar 30.

Figure 4:
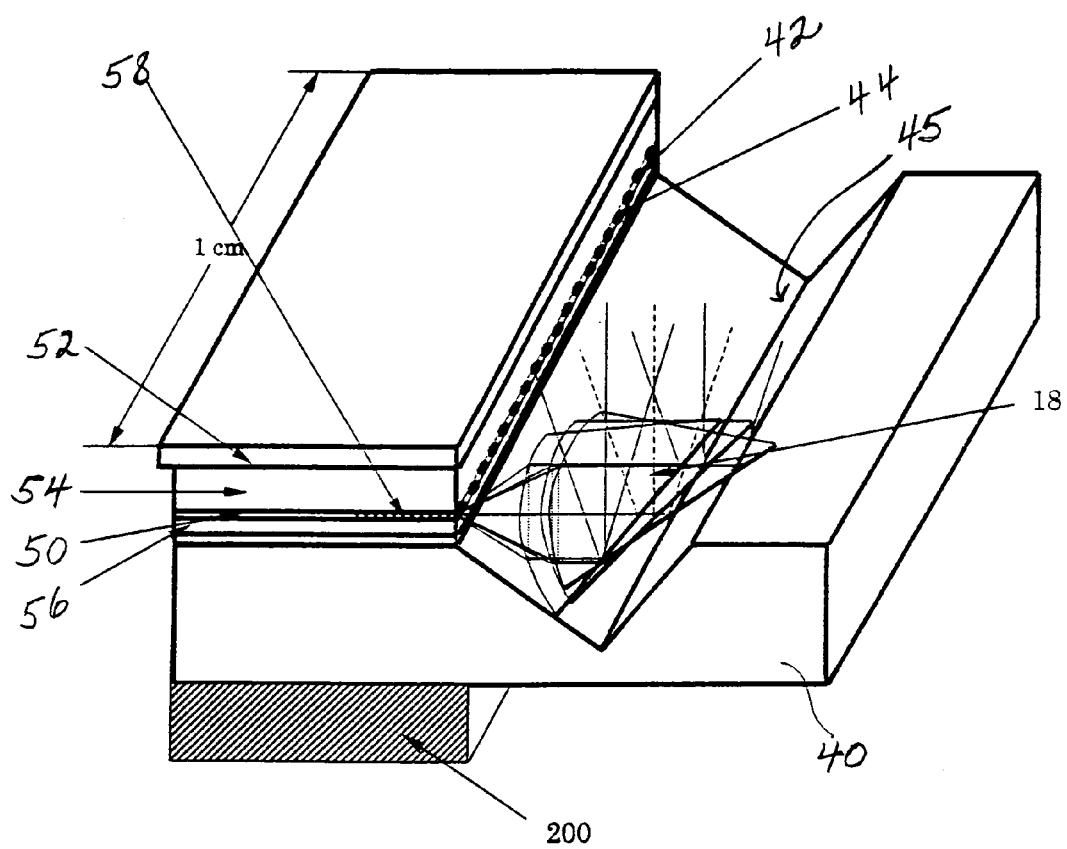
FIG. 4 is a schematic illustration of a beam prism controlled single emitting element of a laser diode bar with cooling system.

In FIG. 4, a single laser diode bar 40 measuring approximately one centimeter (cm) in width contains nineteen emitting elements 42. A quantum-well active layer 50 with emitting elements 42 is sandwiched between a top insulating plate 52, a second top cathode layer 54 and a bottom anode layer 56. A cooling system 200, preferably, a spray cooling system, is connected to the substrate of the laser diode emitting elements 42. The cooling system 200 (not shown in the drawings) is also attached to the back of the laser diode bars in FIGS. 1 and 3. The beam controlled prism 18 is nearly one-quarter of the optical fiber placed on the front of the emitting area 44 of the emitting elements 42 and can be adjusted by the micro-mechanical system which can adjust the direction and the fast-axis divergence angle of the laser diode output beam 58. The beam-controlled prism 18 is connected to the laser diode bar 40 by placing the prism on the groove 45 of the substrate of the laser diode bar 40.

Thus, the present invention provides an efficient disk laser pump source in a novel configuration with an array of diode bars placed on a washer shaped substrate, cooled from the back surface while laser light emitted from the diode bars is focused to a disk-shaped gain medium located below the central hole of the substrate. The high power laser array system is compact, robust and easy to scale to high power laser output, uses fewer optical elements, and it is easy to adjust the pump power delivery and laser output.

The advantages of the invention are less cost, more efficient disk laser pump sources, scalability to higher powers, greatly increased ruggedness, ease of manufacture and compatibility with both disk laser and disk amplifier configurations. It is useful to pump high average power disk lasers for manufacturing, medical and military applications. Manufacturing applications include, but are not limited to, materials processing. Military uses include directed energy weapons that demand the very high beam quality that disk lasers provide.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A diode laser array configuration comprising: an array of diode bars placed on a washer shaped substrate which allows laser light to reach a disk-shaped gain medium located below a central hole in the washer shaped substrate wherein the array of diode bars is on an inside portion of a conical ring thereby compensating for slow axis spread.

2. The configuration of claim 1 wherein the array of diode bars is contiguous with a circular geometry of the washer shaped substrate.

3. The configuration of claim 1, wherein approximately 132 diode bars are used in the array and said configuration has an output power of approximately 5280 watts (W).

4. A method of modifying outputs of a high average power disk laser comprising the steps of:
  (a) operating said disk laser with an array of diode bars placed on a washer shaped substrate which allows laser light to reach the disk-shaped gain medium located below a central hole in the washer shaped substrate wherein the array of diode bars is inside a conical ring that allows laser light to reach the disk-shaped gain medium through the central hole, thereby compensating for slow axis spread; and
  (b) cooling said diode array from a back surface portion whereby said disk laser provides a more efficient disk laser pump source which is scalable to higher powers and is of increased ruggedness.

5. The method of claim 4 including the step of: fitting said diode bars with an optical element to allow for control of angular spread of laser light and direction of propagation away from the surface of the array.

6. The method of claim 5 wherein said step of fitting is by beam control prisms.

7. The method of claim 4 wherein the washer shaped substrate has an inner radius of approximately 40 millimeters (mm) and an outer radius of approximately 56 millimeters (mm) and the laser array has a total power of approximately 5280 watts (W).

8. A method of providing uniformly absorbed pump power distribution with high absorption efficiency of lasers and disk laser amplifiers comprising the steps of:
  (a) placing an array of diode bars on a washer shaped substrate wherein the array of diode bars is inside a conical ring thereby compensating for the slow axis spread problem;
  (b) focusing laser light of a portion of the diode bars to allow emitted light to reach a disk-shaped gain medium located below a central hole of the substrate; and
  (c) cooling the array of diode bars from its back surface.

9. The method of claim 8 wherein the diode bars are fitted with an optical element to allow for control of angular spread of emitted light and direction of propagation away from the surface of the array.

10. The method of claim 9 wherein the optical element fitted on the diode bars is a beam control prism.

11. The method of claim 8 wherein approximately 132 diode bars are used in the array of bars on the washer shaped substrate and the disk-gain medium is located approximately 15 centimeters (cm) below the central hole of the substrate.

12. A method for providing an efficient disk laser pump source that is scalable to higher powers and is of increased ruggedness comprising the steps of:
  (a) placing an array of diode bars on a washer shaped substrate;
  (b) focusing light emission from the diode bars to a disk shaped gain medium located approximately 15 centimeters (cm) below a central hole of the substrate; and
  (c) cooling the array of diode bars.

13. The method of claim 12 wherein the array of diode bars is inside a conical ring thereby compensating for the slow axis spread problem.

14. The method of claim 12 wherein the diode bars are fitted with an optical element to allow for control of angular spread or emitted light and direction of propagation away from the array.

15. The method of claim 14 wherein the optical element is a beam control prism.

16. The method of claim 12 wherein approximately 132 diode bars are used in the array of bars on the washer shaped substrate and the disk-gain medium is located approximately 15 centimeters (cm) below the central hole of the substrate.

17. A high power laser array system comprising:
  a ring-shaped array of approximately 132 diode bars that allow laser light to reach a disk-shaped gain medium located approximately 15 centimeters (cm) below a central hole in the ring shaped array having an inner radius of approximately 40 millimeters (mm) and an outer radius of approximately 56 millimeters (mm), wherein the laser array has a total power of approximately 5280 watts (W).

18. The system of claim 17 wherein the ring-shaped array includes a flat washer shaped substrate.

19. The system of claim 18 wherein the array includes: diode bars stacked along the radii of the washer shaped substrate with the length of each diode bar perpendicular to the radii.

20. The system of claim 17 wherein the ring-shaped array is a conical arrangement.

21. The system of claim 20 wherein a portion of the diode bars are closer to the disk shaped gain medium than other diode bars because of the conical arrangement of the array.

* * * * *